(12) United States Patent
Yuan et al.

(10) Patent No.: US 7,386,819 B1
(45) Date of Patent: Jun. 10, 2008

(54) METHODS OF VERIFYING FUNCTIONAL EQUIVALENCE BETWEEN FPGA AND STRUCTURED ASIC LOGIC CELLS

(75) Inventors: Jinyong Yuan, Cupertino, CA (US); Ji Park, San Jose, CA (US)

(73) Assignee: Altera Corporation, San Jose, CA (US)

( * ) Notice: Subject to any disclaimer, the term of this patent is extended or adjusted under 35 U.S.C. 154(b) by 326 days.

(21) Appl. No.: 11/192,725

(22) Filed: Jul. 28, 2005

(51) Int. Cl.
G06F 17/50 (2006.01)
G06F 9/45 (2006.01)

(52) U.S. Cl. .............................. 716/5; 716/4; 716/17
(58) Field of Classification Search ................ 716/1, 716/3, 4, 5, 17, 18
See application file for complete search history.

(56) References Cited

U.S. PATENT DOCUMENTS

| 5,825,202 | A | 10/1998 | Tavana et al. |
| 5,874,834 | A | 2/1999 | New |
| 6,091,262 | A | 7/2000 | New |
| 6,094,065 | A | 7/2000 | Tavana et al. |
| 6,242,945 | B1 | 6/2001 | New |
| 6,490,707 | B1 | 12/2002 | Baxter |
| 6,515,509 | B1 | 2/2003 | Baxter |
| 6,526,563 | B1 | 2/2003 | Baxter |
| 6,588,006 | B1 * | 7/2003 | Watkins ...................... 716/13 |
| 7,243,329 | B2 * | 7/2007 | Chua et al. ................. 716/16 |
| 7,246,339 | B2 * | 7/2007 | Yuan et al. ................. 716/16 |
| 2004/0111691 | A1 | 6/2004 | Tan et al. |
| 2004/0261052 | A1 | 12/2004 | Perry et al. |
| 2006/0230376 | A1 * | 10/2006 | Yuan et al. ................. 716/17 |
| 2006/0236292 | A1 * | 10/2006 | Delp et al. ................. 716/16 |

OTHER PUBLICATIONS

"LCELL WYSIWYG Description for the Stratix II Family", Version 1.1, Altera Corporation, Mar. 22, 2004.

* cited by examiner

Primary Examiner—Jack Chiang
Assistant Examiner—Nghia M. Doan
(74) Attorney, Agent, or Firm—Ropes & Gray LLP; Robert R. Jackson

(57) ABSTRACT

Structured ASIC circuitry that is intended to be functionally equivalent to a programmed block of FPGA circuitry (e.g., a programmed FPGA LUT) is verified for such functional equivalence by using the specification (logical or physical) for the structured ASIC circuitry as a starting point for an FPGA design project. If the design project results in the same FPGA circuitry as it was intended that the structured ASIC circuitry would be functionally equivalent to, the structured ASIC circuitry has been verified and can be added to one or more libraries of structured ASIC modules that are available for use in providing structured ASIC products that are functionally equivalent to programmed FPGA products.

9 Claims, 12 Drawing Sheets

```
module CHLE_6_4_FEEEFAAAFCCCF000_0 (A, B, C, D, E, F, OUT);
    input A;
    ...
    input F;
    output OUT;

MUX21 M0_i (.D0(M1), .D1(M3), .SEL(A), .OUT(OUT));
    MUX21 M1_i (.D0(N11), .D1(M2), .SEL(B), .OUT(M1));
    NAND N11_i (.A(1'b1), .B(N10), .OUT(N11));
    NAND N10_i (.A(D), .B(C), .OUT(N10));
    MUX21 M2_i (.D0(N21), .D1(1'b1), .SEL(E), .OUT(M2));
    NAND N21_i (.A(1'b1), .B(N10), .OUT(N21));
    MUX21 M3_i (.D0(M1), .D1(1'b1), .SEL(F), .OUT(M3));

// CHLE SIGNATURE:
// (M0 M1 M3 A)(M1 N11 M2 B)(N11 S1 N10)(N10 D C)(M2 N21 S1 E)(N21 S1 N10)(M3 M1 S1 F)

endmodule
```

FIG. 5

```
module CHLE_6_4_FEEEFAAAFCCCF000_D2_0 (A, B, C, D, E, F, OUT);
    input A;
    input B;
    input C;
    input D;
    input E;
    input F;
    output OUT;

mux21_md0d1selm0b_i0m0boutbuf0_i1outbuf0i1out XHLE0 (.I1OUT(OUT), .SEL(A), .D1(M3), .D0(M1));
    mux21_mn1d1selm1b_i0m1boutbuf1_i1outbuf1i1out_n0n0an0bn0out_n1n0outvccn1 XHLE1 (.N0OUT(N10), .N0B(C), .N0A(D), .I1OUT(M1), .SEL(B), .D1(M2));
    mux21_mn1vccselm2b_i0m2boutbuf2_i1outbuf2i1out_n1vccn1bn1 XHLE2 (.N1B(N10), .I1OUT(M2), .SEL(E));
    mux21_md0vccselout XHLE3 (.OUT(M3), .SEL(F), .D0(M1));

// CHLE SIGNATURE:
// ((M0 M1 M3 A)(M1 N11 M2 B)(N11 S1 N10)(N10 D C)(M2 N21 S1 E)(N21 S1 N10)(M3 M1 S1 F)
endmodule
```

FIG. 6

METHODS OF VERIFYING FUNCTIONAL EQUIVALENCE BETWEEN FPGA AND STRUCTURED ASIC LOGIC CELLS

BACKGROUND OF THE INVENTION

This invention relates to methods for ensuring functional equivalence between implementations of a user's logic design in a programmed field-programmable gate array ("FPGA") and a structured application-specific integrated circuit ("ASIC").

References such as Chua et al. U.S. patent application publication 2006/0001444, Yuan et al. U.S. patent application Ser. No. 10/916,305, filed Aug. 11, 2004, Schleicher et al. U.S. patent application Ser. No. 11/050,607, filed Feb. 3, 2005, Yuan et al. U.S. patent application publication 2006/0230376, Pedersen et al. U.S. patent application Ser. No. 11/072,560, filed Mar. 3, 2005, Lim et al. U.S. patent application publication 2006/0267661, Schleicher et al. U.S. patent application publication 2006/0225008, and Tan et al. U.S. patent application publication 2006/0271899 discuss techniques for implementing a user's logic design in either a programmed FPGA or a structured ASIC. One typical objective of these techniques is for these two types of implementations to be functionally equivalent to one another. An important part of these techniques is the use of libraries of structured ASIC implementations of programmed FPGA functions that have been worked out in advance. For example, this greatly speeds up and improves the reliability of the process of providing a structured ASIC that is functionally equivalent to an FPGA programmed to perform a user's logic design. Because of the importance of these libraries, it is correspondingly important to ensure that the information contained in them will serve the intended purpose of functional equivalence.

SUMMARY OF THE INVENTION

In accordance with one possible aspect of this invention a logical specification for a structured ASIC module that has been developed as a functional equivalent to a programmed FPGA logic module or function is verified (i.e., proven to be functionally equivalent to the programmed FPGA module) by using the structured ASIC module logical specification as an input to an FPGA design project. The FPGA design project is performed on the structured ASIC module logical specification, and if that design project results in a specification for an FPGA logic module programmed in the same way as the starting programmed FPGA logic module, the structured ASIC module logical specification is verified and can be added to a library of structured ASIC logical specifications that are available for use.

Another possible aspect of the invention relates to similarly verifying a structured ASIC module physical specification that has been developed from an above-mentioned structured ASIC module logical specification. Once again, an FPGA design project is performed on the structured ASIC module physical specification. If that design project results in a specification for an FPGA logic module programmed in the same way as the starting programmed FPGA logic module, the structured ASIC module physical specification is verified and can be added to a library of such physical specifications that are available for use.

Further features of the invention, its nature and various advantages, will be more apparent from the accompanying drawings and the following detailed description.

BRIEF DESCRIPTION OF THE DRAWINGS

FIG. 5 is an illustrative logical specification for circuitry of the type that can be used as a starting point for the flow shown in FIGS. 4a and 4b.

FIG. 6 is an illustrative physical specification for the circuitry shown in FIG. 5.

DETAILED DESCRIPTION

The references mentioned in the above background section of this specification provide a great deal of information about how FPGAs may be constructed, how structured ASICs may be constructed, and how a user's logic design may be functionally equivalently implemented in these two types of devices.

Figure 2:
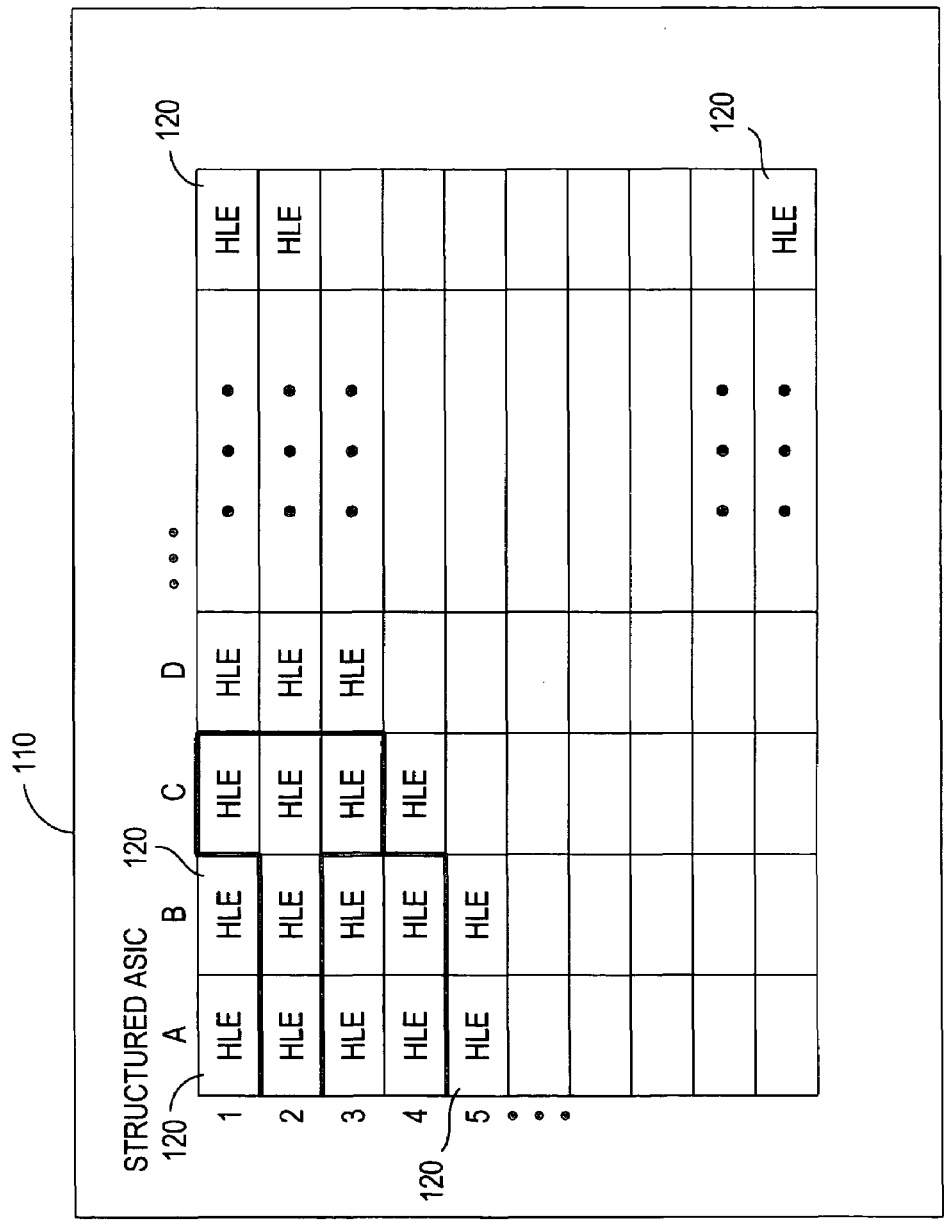
FIG. 2 is a simplified block diagram of an illustrative structured ASIC architecture.
Figure 3:
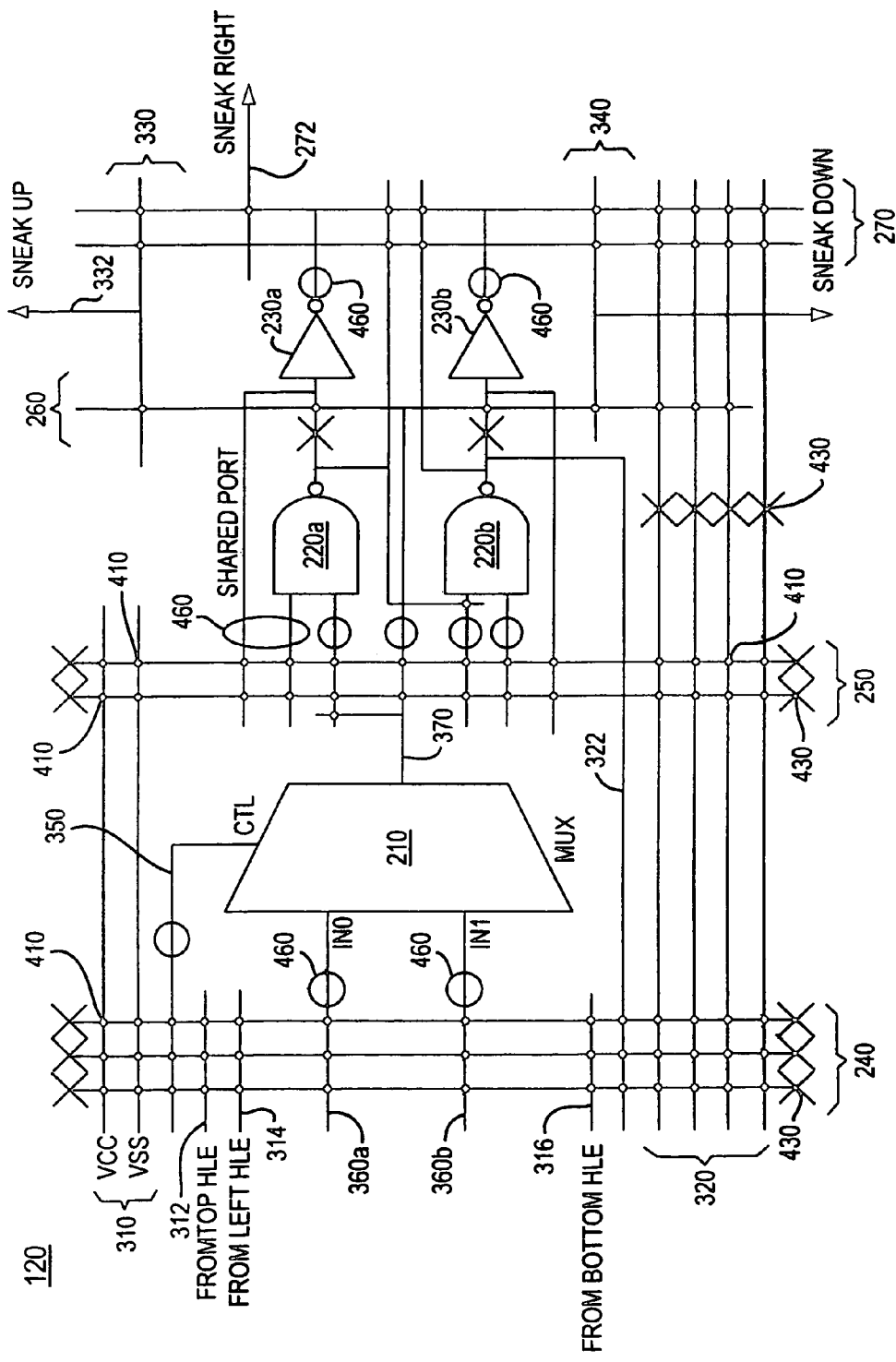
FIG. 3 is a simplified schematic block diagram of an illustrative embodiment of a representative portion of the circuitry shown in FIG. 2.

It will therefore not be necessary to repeat all of such information here. However, FIGS. 1-3 are included to provide some high-level context for what is described later in this specification.

Figure 1:
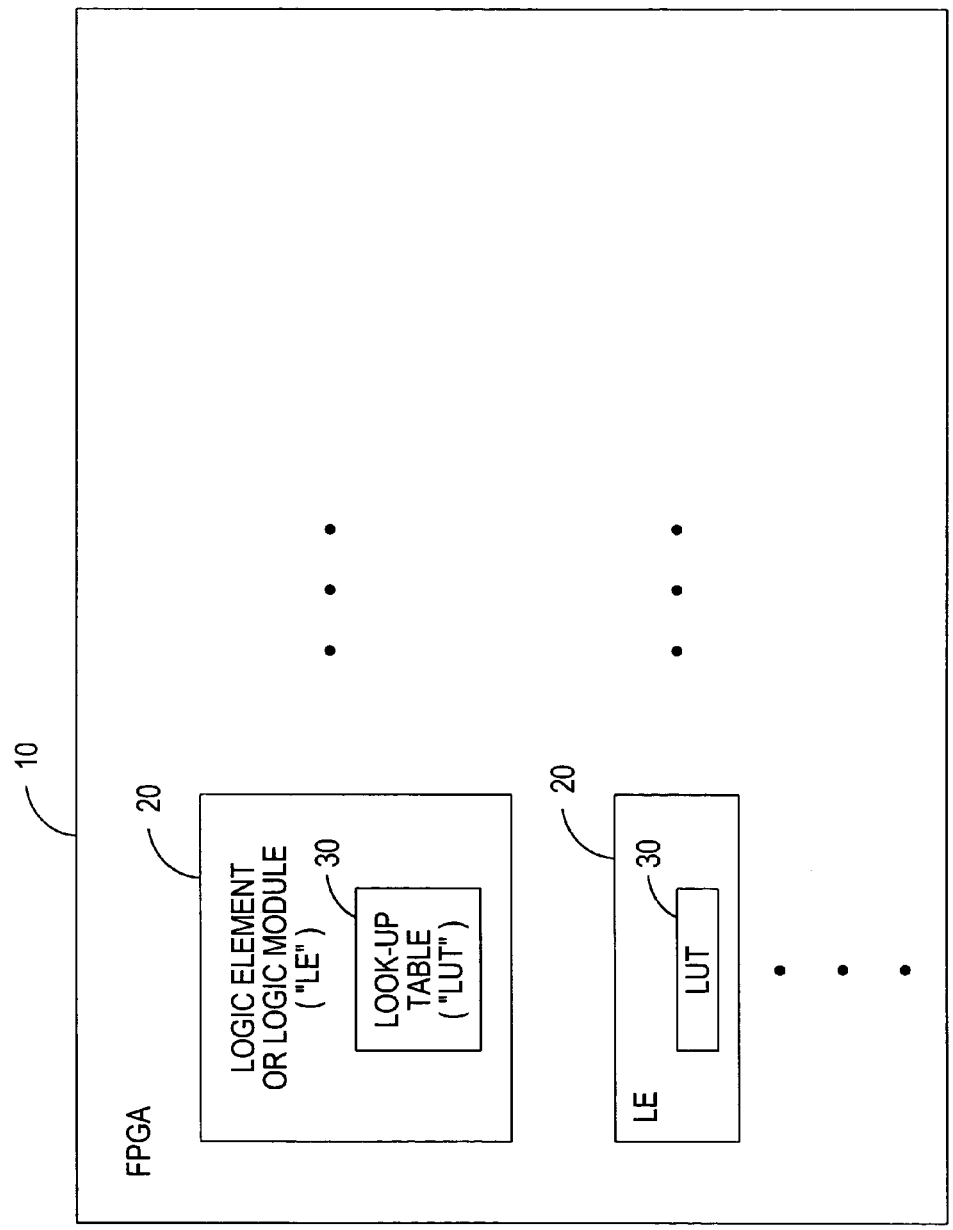
FIG. 1 is a simplified block diagram of an illustrative, conventional, FPGA architecture.

The typical FPGA 10 shown in FIG. 1 includes many logic elements or LEs 20 (which may be of the type sometimes referred to as adaptive logic elements or ALEs.). Each LE 20 includes a look-up table or LUT 30 that is programmable to provide any logical combination of several input signals that are applied to the LUT. For example, a LUT 30 may be programmable to provide any logical combination of six input signals applied to the LUT. This is only an example, of course, and LUTs with fewer than six inputs or more than six inputs may be used instead, if desired. However, six will generally be the assumed number of inputs to a LUT throughout this specification.

Although not shown in FIG. 1, FPGA 10 also typically includes other circuitry, such programmable interconnection circuitry for conveying signals to, from, and/or between the LEs 20 (and therefore the LUTs 30) on the device. By programming the LUTs and the interconnection circuitry (and also possibly other circuitry on the device), FPGA 10 can be made to perform any of a vast number of different logic designs that users of the device may desire to have performed.

Once a user's logic design has been "proven" in FPGA 10, and if the demand for that design reaches a sufficiently high volume, it may be desirable (e.g., for reasons of cost reduction) to "migrate" the design to a functionally equivalent ASIC device. To facilitate such migration (and as is explained in more detail in the above-mentioned references), a structured ASIC design may be used. An example of a structured ASIC architecture is shown in FIG. 2. This architecture of a structured ASIC 110 includes an array of the basic circuitry of many relatively small logic elements 120 (called hybrid logic elements or HLEs). An illustrative embodiment of a representative HLE 120 is shown in FIG. 3 and described briefly below. This architecture of the structured ASIC is the same for all products made using this architecture. The ASIC is customized to perform a particular user logic design by customizing only some of the masks used to make the ASIC that will perform that logic. For example, the masks that are customized in this way may include those that provide certain interconnections within HLEs 120 and between adjacent HLEs. This customizes the function(s) performed by each HLE. Long-distance interconnections to, from, and/or between HLEs may also be in customized masks. However, the basic circuitry of all HLEs is the same for all products made using this structured ASIC architecture.

As the above-mentioned references make clear, another aspect of facilitating the provision of a structured ASIC product that is functionally equivalent to an FPGA that has been programmed to perform a user's logic design is to separately implement in the structured ASIC the function performed by each FPGA LUT 30. Because an FPGA LUT is typically logically more powerful than an HLE 120, it is often necessary to use several adjacent or nearby HLEs to perform the function of one FPGA LUT. "Cluster of HLEs" or CHLE is the term used for HLEs that are working together to perform the function of one FPGA LUT. It may be desirable to limit the maximum size of a CHLE (e.g., to no more than six HLEs). If that is done, and if the function performed by an FPGA LUT is sufficiently complex, it may be necessary to have more than one CHLE performing the function of the LUT. In FIG. 2 the heavy lines show examples of how various numbers of HLEs are grouped together in CHLEs as needed to perform the functions of various FPGA LUTs. Using the row and column identifiers in FIG. 2, a first CHLE includes HLEs A1 and B1; a second CHLE includes HLEs C1, A2, B2, C2, and C3; and a third CHLE includes HLEs A3, B3, A4, and B4.

There are so many possible logic functions that an FPGA LUT can perform, and the task of devising functionally equivalent CHLEs is so substantial and critical to successful production of functionally equivalent FPGA and structured ASIC implementations of a user's logic design, that it is very helpful to employ libraries of previously developed structured ASIC implementations of as many of the possible LUT functions as it is reasonably possible to have in those libraries. It is an objective of this invention to help make sure that a structured ASIC implementation is only added to such a library when there is high confidence that the implementation is indeed functionally equivalent to the target FPGA LUT function. This is called verifying the structured ASIC implementation.

Devising a structured ASIC implementation of an FPGA LUT function typically includes at least two phases. The first phase is developing a logical design specification for a CHLE that will implement the LUT function. The second phase is, starting from the logical design specification that is the result of the first phase, developing a physical design specification for the CHLE. The present invention includes aspects for verifying the results of each of these two phases.

A final preliminary to description of the verification aspects of the invention is the following brief description of the illustrative HLE circuitry 120 shown in FIG. 3 (which, except for the general HLE reference number, is identical to FIG. 3 in above-mentioned Chua et al. U.S. patent application Ser. No. 10/884,460). As shown in FIG. 3, HLE 120 includes two-input multiplexer 210, NAND gates 220a and 220b, and inverters 230a and 230b. HLE 120 also includes some interconnection resources, some of which are mask-programmable. For example, Xs like 430 identify locations at which conductor segments can be connected to one another or not, as desired, by appropriately customizing a mask (or masks) used to make the ASIC. Similarly, Os like 460 identify locations at which connections can be made, if desired, to one or more circuit layers (not shown) in which relatively long-distance interconnection conductors can be provided. Again, these connections and interconnections are made by appropriately customizing one or more of the masks used to make the ASIC. The solid dots such as 410 in FIG. 3 are also connections that can be made or not made, as desired, between the intersecting conductors. Once again, these connections are made, if desired, by appropriately customizing one or more of the masks used to make the ASIC. Other reference numbers in FIG. 3 refer to various types of conductors in the HLE.

We turn now to a description of verification of logical and physical specifications of CHLEs in accordance with this invention.

Figure 4A:
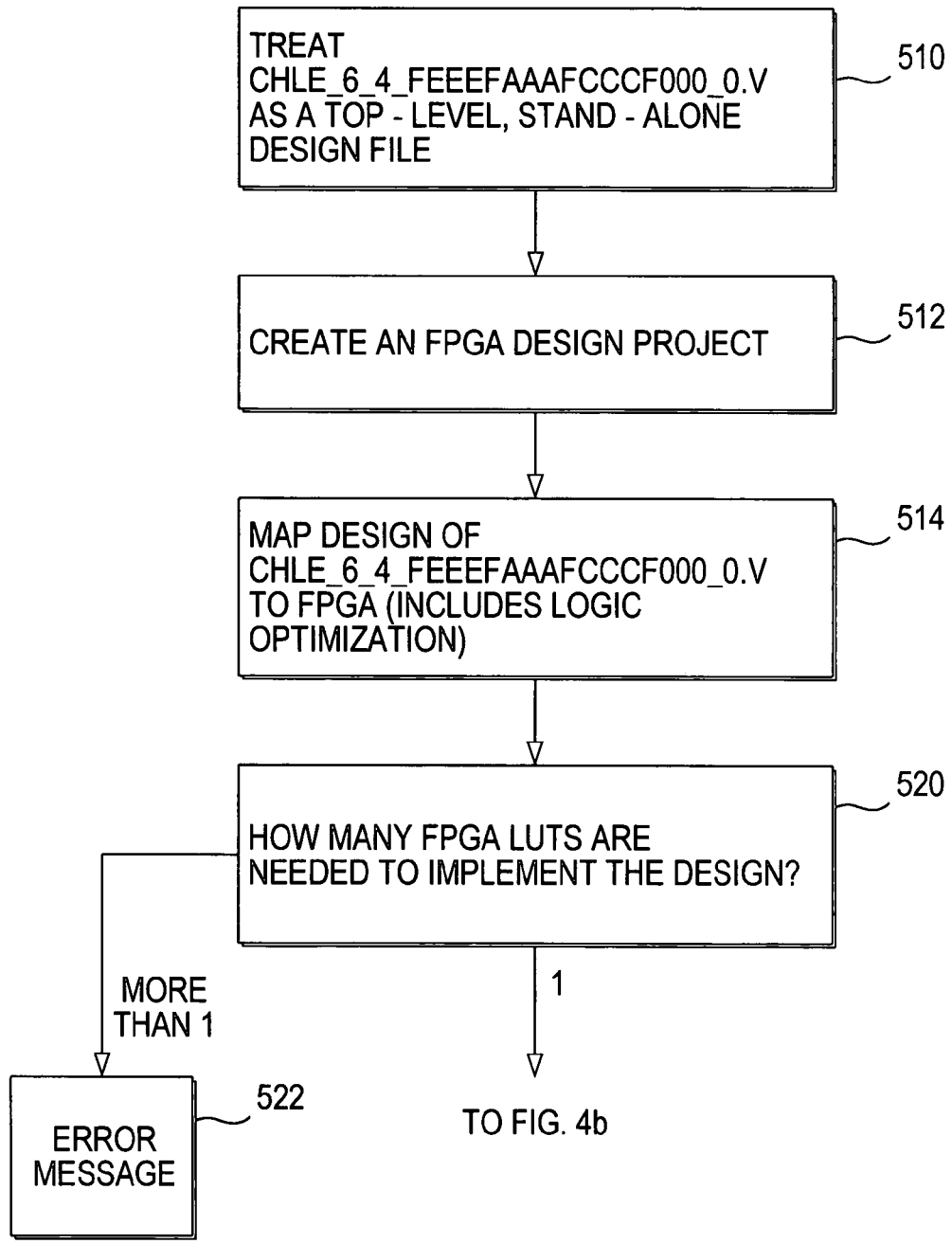
FIGS. 4a and 4b are collectively an illustrative embodiment of a verification flow in accordance with a possible aspect of the invention.
Figure 4B:
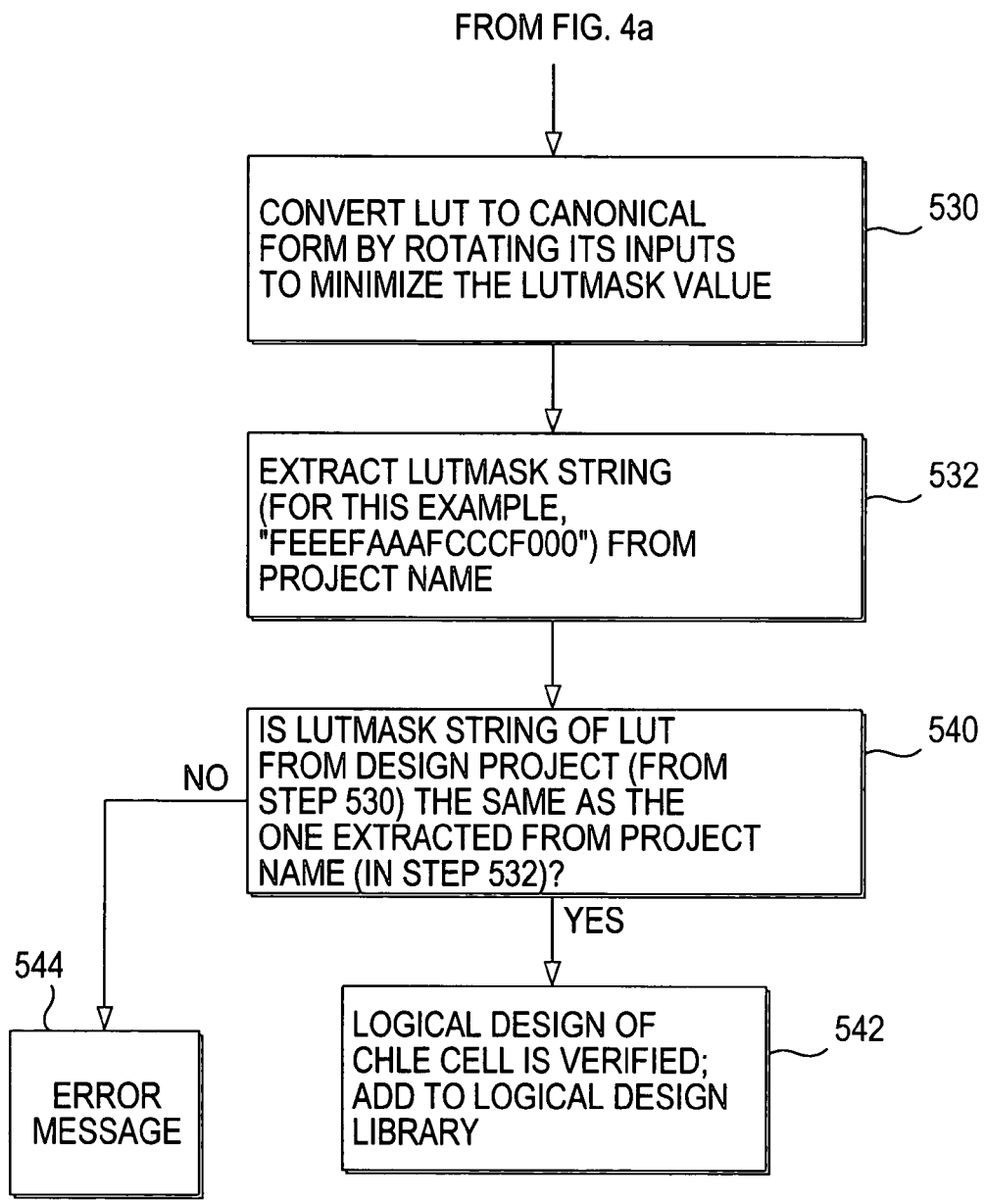

The logical-side verification flow is shown in FIGS. 4a and 4b. A logical design for a structured ASIC CHLE implementation of a particular programmed FPGA LUT function has already been developed. For example, FIG. 5 shows an already-developed logical design for a CHLE that is intended to be functionally equivalent to an FPGA LUT having six inputs and a 64-bit memory programmed with the hexadecimal value FEEEFAAAFCCCF000. It is the purpose of the flow of FIGS. 4a and 4b to verify that this logical design (FIG. 5) for a structured ASIC CHLE is in fact functionally equivalent to the programmed FPGA LUT it is intended to be equivalent to.

Before continuing with FIGS. 4a and 4b, it may be helpful to briefly explain what FIG. 5 shows (for the depicted example, of course). FIG. 5 can be in standard Verilog or any other generally comparable representation. The first line in FIG. 5 ("module CHLE_6_4 . . . ") includes (in order, from left to right) the following information about the illustrative CHLE logical design: the number of inputs ("6"); the number of HLEs in the CHLE ("4"); the lutmask value ("FEEEFAAAFCCCF000"), which, again, are 16 hexadecimal digits representing the 64 bits stored in the look-up table of the LUT); the version number associated with the following implementation of a LUT having this lutmask value ("0"); and reference names of the inputs to and output from the CHLE ("(A, B, C, D, E, F, OUT)"). It should be noted that the lutmask value is the minimum for a LUT performing the logical function that this LUT performs. This minimum lutmask value is the result of making sure that the LUT is in canonical form (i.e., a standardized or normalized form in which the inputs to the LUT have been rotated or permuted until the minimum lutmask value is achieved).

The next few lines in FIG. 5 are standard Verilog statements identifying inputs (e.g., "input A") and outputs ("output OUT"). Again, the use of standard Verilog is only illustrative.

After the above-described lines, the next several lines in FIG. 5 specify each of the devices in the CHLE. There is one line for each such device. Once again, standard Verilog is shown for purposes of illustration. For example, the first of these lines ("MUX21 M0_i . . . ") is for a 2-to-1 multiplexer that is given the name M0. Its first selectable input ("D0") comes from the output of the multiplexer called M1, and its second selectable input ("D1") comes from the output of the multiplexer called M3. Its selection control ("SEL") input comes from input A. And its output ("OUT") is the OUT signal of the CHLE. The following convention is used in assigning names: M means MUX (multiplexer), N means NAND gate, I means INV (inverter), S0 means ground, S1 means VCC, and A through F indicate the inputs. The first number (if any) following a character other than S indicates which HLE the element belongs to. The second number (if any) following that indicates the instance of the specified type of device in the HLE.

Following the above-described specification lines are two comment lines ("//CHLE SIGNATURE:" and "// (M0, M1 . . . )"). The contents of the second of these lines is the "CHLE signature" of the CHLE specified by the preceding lines. It will be noted that the CHLE signature is just a condensed representation of the lines above. For example, the "(M0 M1 M3 A)" portion of the CHLE signature comes from the "MUX21 M0_i . . . " line above. The CHLE signature is thus a complete, although abbreviated or condensed, representation of the CHLE.

Returning now to FIGS. 4a and 4b, the depicted flow begins with step 510, in which the logical design specification for the CHLE that is to be verified (e.g., the logical design specification in FIG. 5) is treated as a top-level, stand-alone design file that is to be implemented in an FPGA of the type for which a structured ASIC including the specified CHLE is intended to be a functioned equivalent. (Throughout FIGS. 4a and 4b the particular CHLE specification shown in FIG. 5 is referred to as an example. It is emphasized, however, that this is only an example, and that the flow of FIGS. 4a and 4b can be carried out on any CHLE logical specification.)

In step 512 an FPGA design project is created to work on the CHLE logical specification that is to be verified. This can be done using any suitable FPGA design tool (i.e., software that is used to implement a user's logic design in an FPGA of the relevant type). In this case the "user's logic design" mentioned above is just the logical specification of the single CHLE to be verified (e.g., the CHLE specification in FIG. 5).

In step 514 the logical specification of the CHLE to be verified (e.g., as in FIG. 5) is mapped to the relevant type of FPGA using the FPGA design tool software mentioned in the preceding paragraph. As noted in step 514, this typically includes logic optimization.

In step 520 the FPGA design that results from the preceding steps is tested with respect to how many FPGA LUTs it has been found necessary to use in that design. If more than one FPGA LUT is required, a design principle has been violated because a structured ASIC CHLE is never supposed to include more logic than can be implemented in one FPGA LUT. Accordingly, if step 520 detects that more than one FPGA LUT has been found necessary to implement the logical design of the CHLE being considered, control passes from step 520 to step 522, which produces an error message indicating that this CHLE logical design should not be used for any structured ASIC that is intended to be functionally equivalent to any programmed FPGA. On the other hand, if step 520 detects that only one FPGA LUT has been found necessary to implement the CHLE logical design being considered, the process of verifying that CHLE logical design can continue with step 530.

In step 530 the FPGA LUT configuration (programmed state) that has been designed (in the preceding steps) to implement the CHLE logical design being considered is converted to canonical form by rotating or permuting its inputs to minimize the lutmask value of the LUT.

In step 532 the lutmask value is extracted from the project name (i.e., the project name used in steps 510 and 512 to initiate the flow being discussed). It will be remembered that the CHLE logical design being considered comes with a name that includes the minimum lutmask value for the programmed FPGA LUT logic function that the CHLE logical design is intended to be functionally equivalent to. It is this lutmask value that step 532 extracts from the project name for the flow being discussed.

In step 540, the currently computed minimum lutmask value from step 530 is compared to the lutmask value extracted from the project name in step 532. If these two lutmask values are the same, the cell (i.e., the CHLE logical design) is verified, as indicated by control passing to step 542. If the two lutmask values compared in step 540 are not the same, control passes from step 540 to step 544, in which an error message is generated to indicate that the correctness of the CHLE logical design being considered has not been verified, and that this CHLE logical design should accordingly not be used.

It will be apparent from the foregoing that what the flow of FIGS. 4a and 4b basically does it to take a CHLE logical design that has been developed as a structured ASIC implementation of an FPGA LUT that is programmed in a particular way, and attempt to get back to an FPGA LUT programmed in the same way by designing an FPGA implementation of that CHLE logical design. If the endpoint of this process is the same as the starting point (i.e., the same minimum lutmask value), the CHLE logical design and the programmed FPGA LUT should be functionally equivalent (with a very high level of confidence). The CHLE logical design is therefore "verified." But if the starting and ending minimum lutmask values are not the same, the CHLE logical design and the programmed FPGA LUT may not be functionally equivalent, and the CHLE logical design should accordingly not be used.

A CHLE logical design that has been verified as described above can be added to a library of logical designs that are available for use in providing structured ASIC products that are functionally equivalent to programmed FPGAs. Hence step 542 in FIG. 4b refers to adding the verified logical design to such a library.

After the logical design of a CHLE has been verified as described above, that logical design can be further processed to produce a physical design for actually implementing that CHLE in a structured ASIC. The details of how that is done are not pertinent to the present invention. For example, it may be done as a largely manual process subject to constraints such as not permitting movement or elimination of any inverters or NAND gates specified in the logical design. However, otherwise un-used inverters and/or NAND gates in the HLEs may be used to increase driving strength of the CHLE. In general, the HLE boundaries within the CHLE are maintained.

FIG. 6 shows a typical physical specification for a CHLE that results from the process described in the preceding paragraph. Once again, the physical specification shown in FIG. 6 is expressed in normal Verilog, but it will be understood that any other representation can be used instead if desired. The first line in FIG. 6 gives the module name in a form very similar to what is shown in FIG. 5. D2 is the output drive strength of the module. Note that the minimum lutmask value ("FEEEFAAAFCCCF000") continues to be an important part of the module name. This information has been carried over from the FIG. 5 logical specification to this FIG. 6 physical specification.

The next few lines in FIG. 6 name the inputs and outputs of the CHLE.

Each of the next four "lines" (some of which actually occupy two lines) is a physical specification for a respective one of the four HLEs in the CHLE. For example, "mux21_md0d1selm0b_i0M0boutbuf0_i1outbuf0i1out XHLE0" is the name of HLE "0" in the CHLE. ".I1OUT (OUT)," ".SEL(A)," ".D1 (M3)," and ".D0 (M1)" are the port connections of that HLE.

FIG. 6 concludes with the CHLE signature, which is the same as in FIG. 5, and which, indeed, has been carried forward from the FIG. 5 logical specification.

Figure 7A:
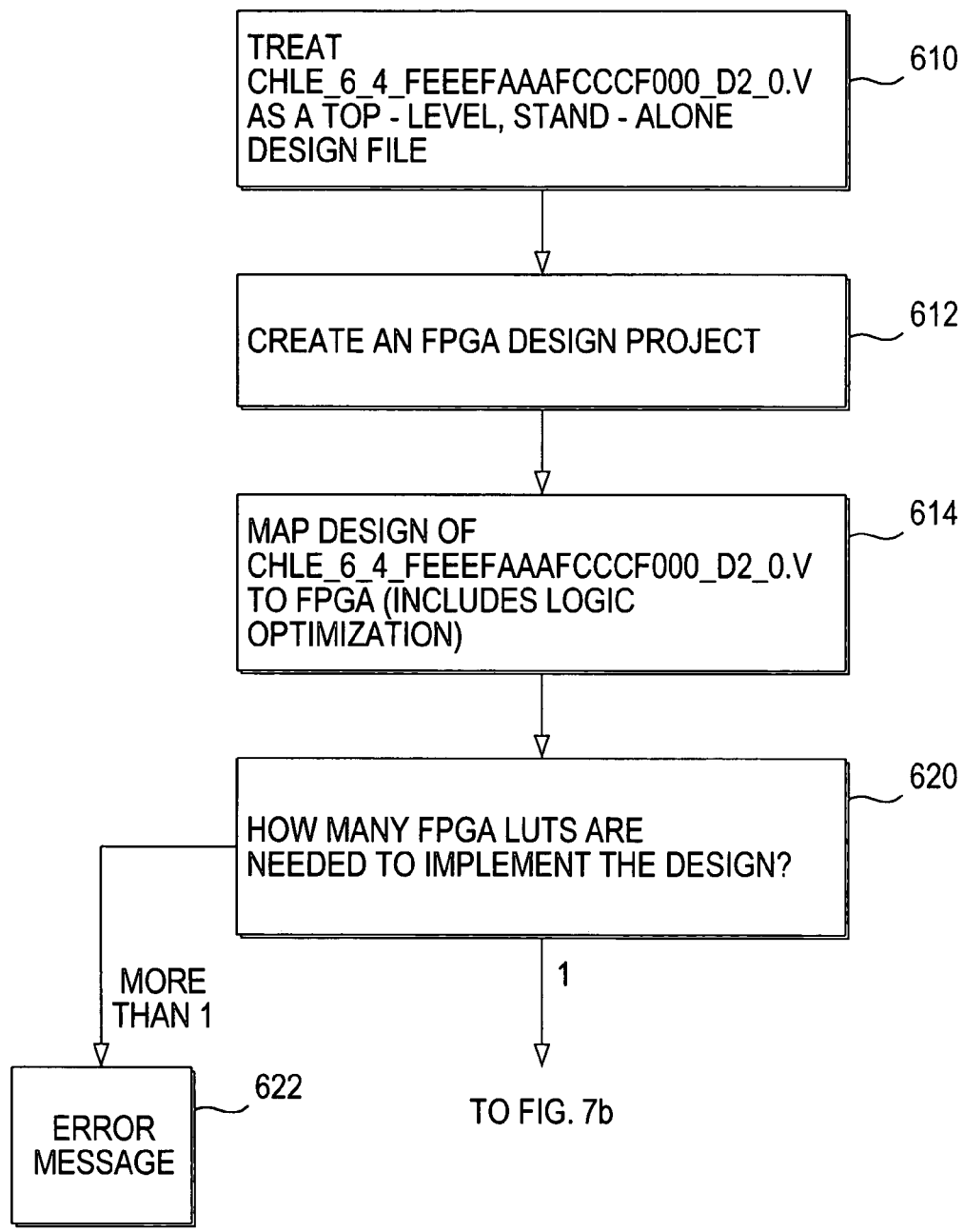
FIGS. 7a and 7b are collectively an illustrative embodiment of another verification flow in accordance with another possible aspect of the invention. This flow operates on physical circuit specifications of the type illustrated by FIG. 6.
Figure 7B:
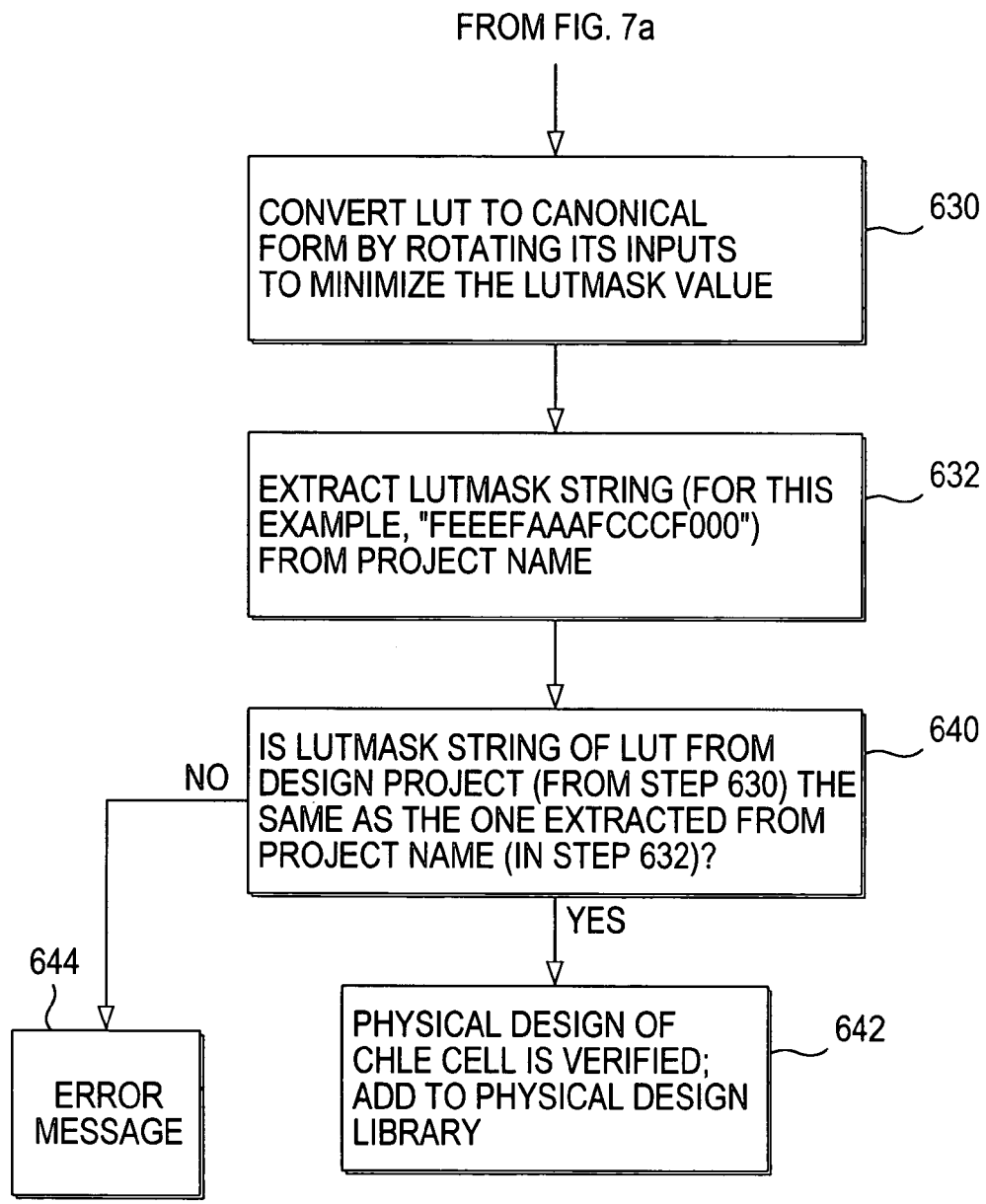

Before making any actual use of a physical design file such as the one shown in FIG. 6, the suitability of that file for its intended purpose (i.e., functional equivalence to the starting programmed FPGA LUT) is first verified in accordance the present invention. An illustrative embodiment of the verification flow is shown in FIGS. 7a and 7b. These FIGS. are very similar to FIGS. 4a and 4b, and so the description of them can be somewhat abbreviated.

In step 610 the physical design specification for the CHLE that is to be verified (e.g., the physical design specification in FIG. 6) is treated as a top-level, stand-alone design file that is to be implemented in an FPGA of the type for which a structured ASIC including the specified CHLE is intended to be a functional equivalent. (Again, throughout FIGS. 7a and 7b the particular CHLE physical specification shown in FIG. 6 is referred to as an example. It will be understood that the flow of FIGS. 7a and 7b can be carried out on any CHLE specification.)

In step 612 an FPGA design project is created to work on the CHLE physical design specification that is to be verified. This can be done using the same FPGA design tool that is used in the flow of FIGS. 4a and 4b.

In step 614 the physical specification of the CHLE to be verified (e.g., as in FIG. 6) is mapped to the relevant type of FPGA using the FPGA design tool mentioned in the preceding paragraph. As noted in step 614, this typically includes logic optimization.

In step 620 the FPGA design that results from the preceding steps is tested with respect to how many FPGA LUTs it has been found necessary to use in that design. If more than one FPGA LUT is required, the design principle mentioned in connection with FIGS. 4a and 4b has been violated and control passes to step 622 for generation of an error message to indicate that the physical design specification should not be used. On the other hand, if step 620 detects that only one FPGA LUT has been found necessary to implement the CHLE physical design being considered, the process of verifying that physical design can continue with step 630.

In step 630 the FPGA LUT configuration (programmed state) that has been designed (in the preceding steps) to implement the CHLE physical design being considered is converted to canonical form by rotating or permuting its inputs to minimize the lutmask value of the LUT.

In step 632 the lutmask value is extracted from the project name (i.e., the project name used in steps 610 and 612 to initiate the flow being discussed). Again, it will be remembered that the CHLE physical design comes with a name that includes the minimum lutmask value for the programmed FPGA LUT logic function that the CHLE physical design is intended to be functionally equivalent to. It is this lutmask value that step 632 extracts from the project name for the flow being discussed.

In step 640, the currently computed minimum lutmask value from step 630 is compared to the lutmask value extracted from the project name in step 632. If these two lutmask values are the same, the physical design of the CHLE cell is verified, as indicated by control passing to step 642. This means that this physical design can be added to a library of such designs that are available for use in producing structured ASICs that will be functionally equivalent to programmed FPGAs.

Figure 8:
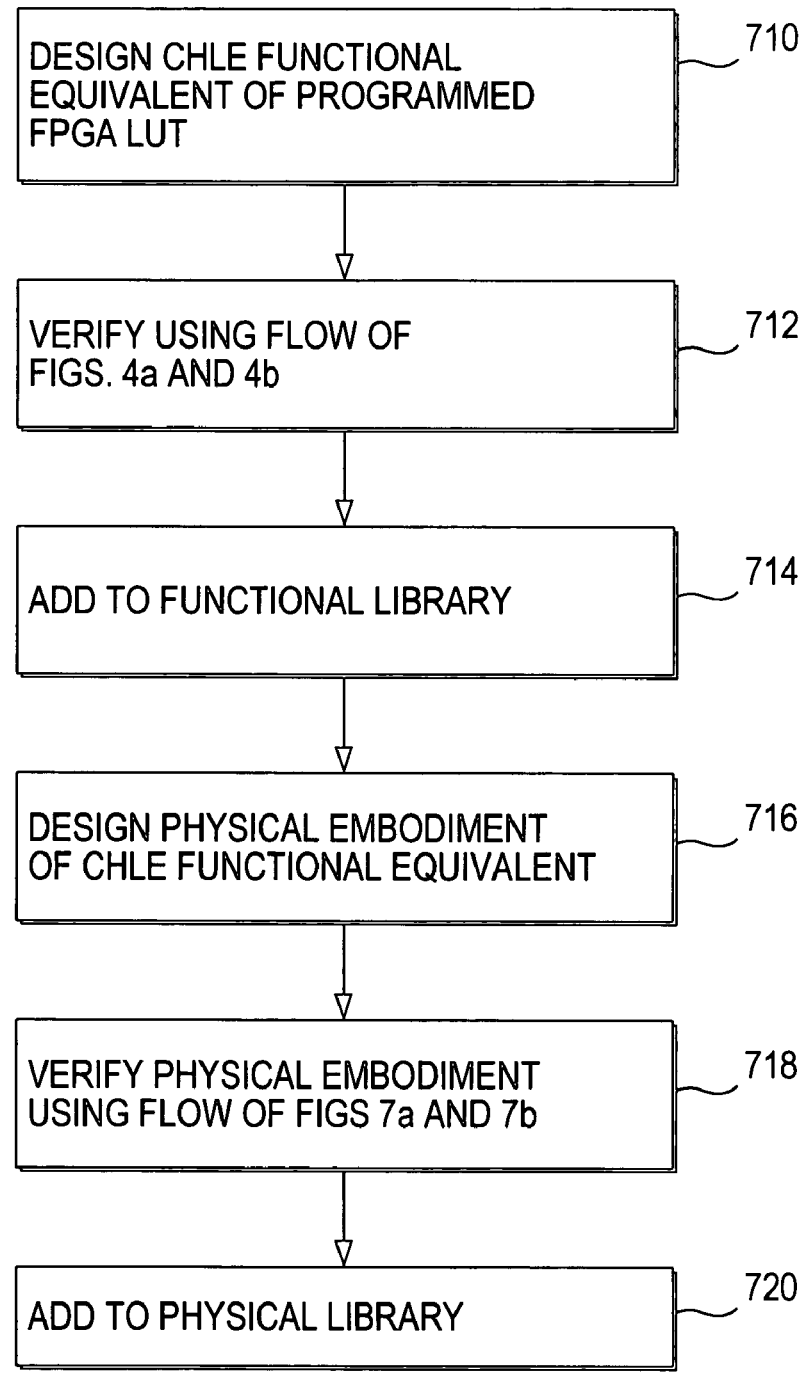
FIG. 8 is an illustrative embodiment of a flow that makes use of flows like those shown in FIGS. 4a, 4b, 7a, and 7b in accordance with the invention.

FIG. 8 shows a high-level view of use of the flows of FIGS. 4a, 4b, 7a, and 7b in accordance with the invention. In step 710 an FPGA LUT that is programmed to perform a particular logical function that is or that may be desired by a user is considered. An equivalent of this logical function is designed using one or more HLEs to produce a CHLE functional design specification (e.g., as in FIG. 5). In step 712 the functional design from step 710 is verified using the flow of FIGS. 4a and 4b. In step 714 the verified functional design is added to a library of such designs.

In step 716 a physical model of the CHLE functional specification is designed (e.g., as in FIG. 6). In step 718 this physical model is verified using the flow of FIGS. 7a and 7b. In step 720 the verified physical design is added to a library of such designs.

Figure 9:
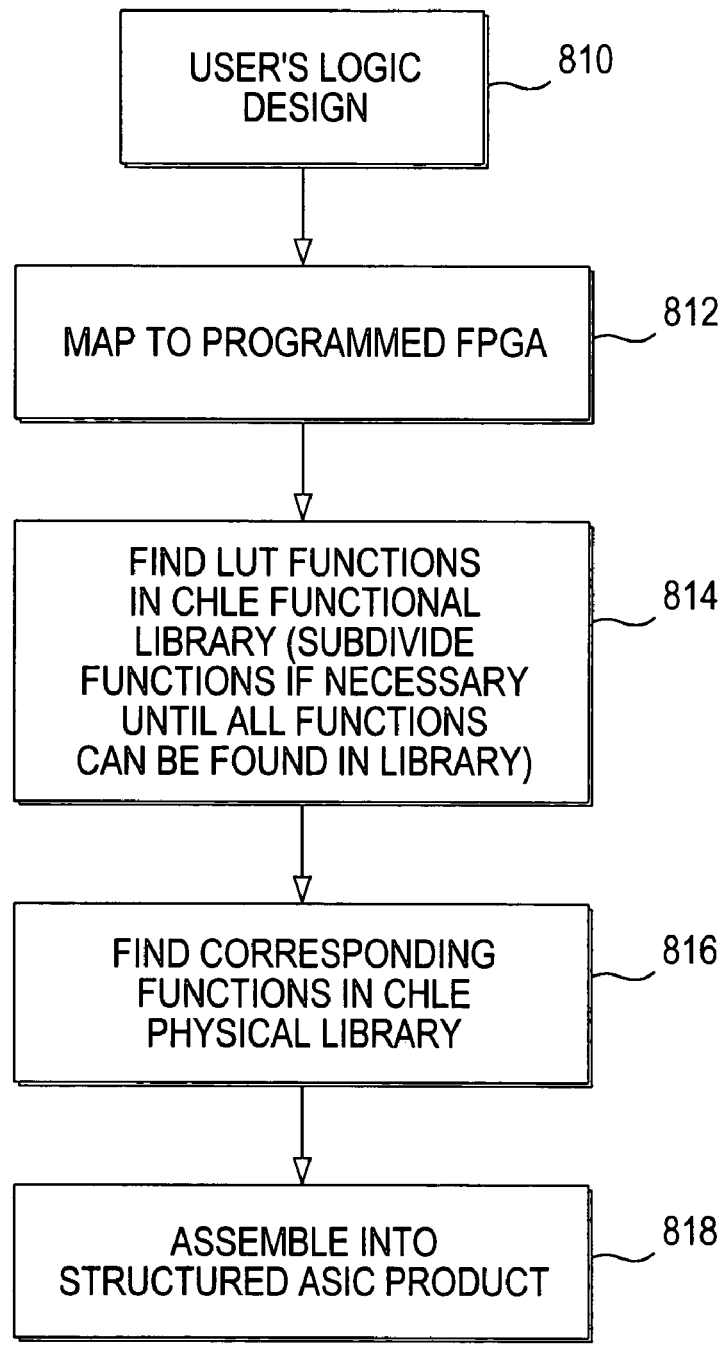
FIG. 9 is an illustrative embodiment of a flow that makes use of libraries of verified circuit designs in accordance with the invention.

FIG. 9 is a high-level view of how the libraries developed using the flow of FIG. 8 may be used to implement a user's logic design in a structured ASIC product that is functionally equivalent to an FPGA programmed to implement that user logic. The user's logic design is provided in step 810. In step 812 the user's logic design is mapped to a programmed FPGA (or to a specification that can lead to programming an FPGA to perform the user's logic design). In step 814 the function of each LUT in the step 812 specification for a programmed FPGA is found in the library that has been developed per step 714 in FIG. 8. If necessary, the function of a LUT can be subdivided into smaller functions to accomplish the step 814 task.

In step 816 the physical library equivalent of each function that has been found in the functional library in step 814 is found. The physical library referred to in step 816 is the one developed per step 720 in FIG. 8. In step 818 the structured ASIC product design is assembled using the physical library modules retrieved in step 816.

Figure 10:
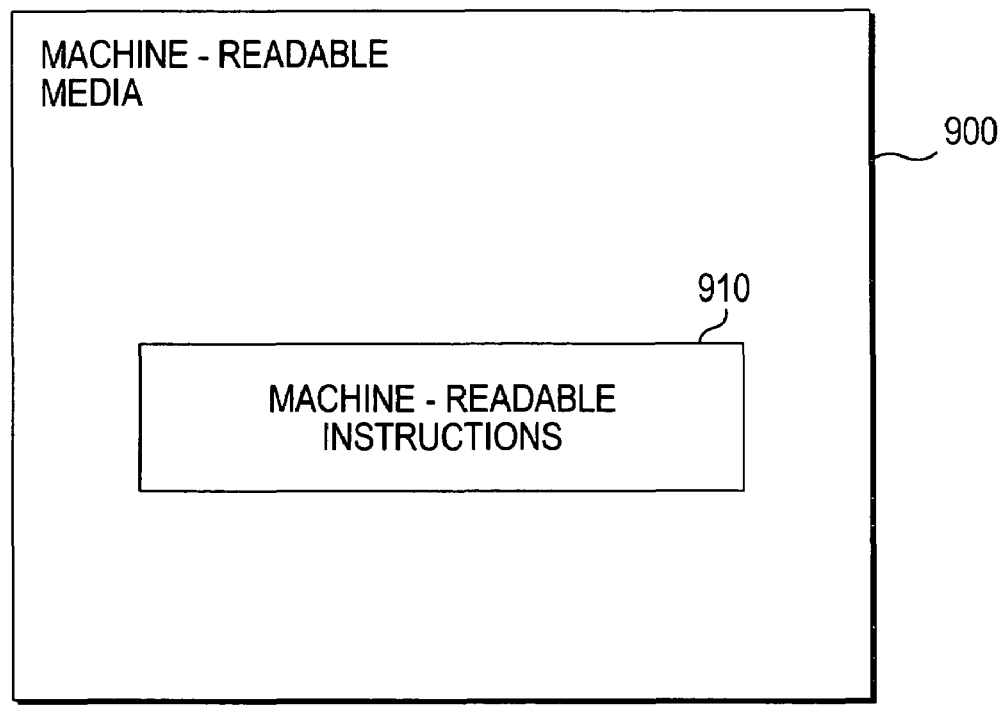
FIG. 10 is a simplified block diagram of illustrative machine-readable media in accordance with a possible aspect of the invention.

FIG. 10 illustrates another possible aspect of the invention. This is machine-readable media 900 (e.g., magnetic disc(s), optical disc(s), magnetic tape(s), or the like) encoded with machine-readable instructions 910 (e.g., a computer program) for at least partly performing one or more methods in accordance with the invention.

It will be understood that the foregoing is only illustrative of the principles of the invention, and that various modifications can be made by those skilled in the art without departing from the scope and spirit of the invention. For example, the size and functional capability of an FPGA LUT can vary. Similarly, the size and functional capability of a structured ASIC HLE can vary. The member of HLEs that are permitted to be used together in a CHLE can vary.

What is claimed is:

1. A method of verifying functional equivalence between a unit of FPGA circuitry that is programmed to perform a particular look-up table logic function and a unit of structured ASIC circuitry that is intended to perform that same function logic comprising:

providing a design specification for the unit of structured ASIC circuitry;

using the design specification to develop an FPGA design for programming FPGA circuitry;

comparing FPGA circuitry programmed in accordance with the FPGA design to the unit of FPGA circuitry that is programmed to perform the particular look-up table logic function; and accepting the design specification for the unit of structured ASIC circuitry as functionally equivalent to the unit of FPGA circuitry only if the FPGA circuitry programmed in accordance with the FPGA design is the same as the unit of FPGA circuitry that is programmed to perform the particular look-up table logic function.

2. The method defined in claim 1 wherein the design specification comprises a logical design specification.

3. The method defined in claim 1 wherein the design specification comprises a physical design specification.

4. The method defined in claim 1 wherein the particular look-up table logic function that the unit of FPGA circuitry is programmed to perform is associated with a numerical value that corresponds to how a look-up table in the unit of FPGA circuitry is programmed to perform that function.

5. The method defined in claim 4 wherein the using comprises:

determining the numerical value that is associated with the function performed by FPGA circuitry that is programmed in accordance with the FPGA design.

6. The method defined in claim 5 wherein the comparing comprises:

comparing the numerical value associated with the unit of FPGA circuitry to the numerical value that results from the determining.

7. The method defined in claim 6 wherein the numerical value associated with the unit of FPGA circuitry is based on a canonical form of that circuitry, and wherein the using comprises:

converting the FPGA circuitry that is programmed in accordance with the FPGA design to the canonical form prior to the comparing.

8. The method defined in claim 1 further comprising:

saving the design specification in a library of such design specifications if the design specification is accepted in the accepting.

9. Machine-readable media encoded with machine-readable instructions for performing the method defined in claim 1.

* * * * *

UNITED STATES PATENT AND TRADEMARK OFFICE
CERTIFICATE OF CORRECTION

| | | |
|---|---|---|
| PATENT NO. | : 7,386,819 B1 | Page 1 of 1 |
| APPLICATION NO. | : 11/192725 | |
| DATED | : June 10, 2008 | |
| INVENTOR(S) | : Jinyong Yuan et al. | |

It is certified that error appears in the above-identified patent and that said Letters Patent is hereby corrected as shown below:

Column 8, line 67, change "function logic" to --logic function--.

Signed and Sealed this

Twenty-eighth Day of October, 2008

JON W. DUDAS
*Director of the United States Patent and Trademark Office*